(12) United States Patent
Ames et al.

(10) Patent No.: US 6,425,280 B1
(45) Date of Patent: Jul. 30, 2002

(54) WAFER ALIGNMENT JIG FOR WAFER-HANDLING SYSTEMS

(75) Inventors: Dennis B. Ames, Danbury; John J. Bacich, Brookfield, both of CT (US)

(73) Assignees: International Business Machines Corporation, Armonk, NY (US); SVG Lithography Systems, Inc., wilton, CT (US)

(*) Notice: Subject to any disclaimer, the term of this patent is extended or adjusted under 35 U.S.C. 154(b) by 0 days.

(21) Appl. No.: 09/363,739

(22) Filed: Jul. 30, 1999

(51) Int. Cl.[7] .................................................. G01B 5/25
(52) U.S. Cl. .......................... 73/1.79; 414/936; 33/645
(58) Field of Search .......................... 33/520, 533, 613, 33/644, 645; 414/805, 936, 806, 567, 567.1, 568, 573; 73/1.79

(56) References Cited

U.S. PATENT DOCUMENTS

| | | | | |
|---|---|---|---|---|
| 3,790,051 A | * | 2/1974 | Moore | 225/1 |
| 5,125,791 A | * | 6/1992 | Volovich | 348/446 |
| 5,308,222 A | * | 5/1994 | Bacchi et al. | 414/783 |
| 5,438,418 A | | 8/1995 | Fukui et al. | |
| 5,642,298 A | * | 6/1997 | Mallory et al. | 702/117 |
| 5,822,213 A | * | 10/1998 | Huynh | 364/478.01 |
| 5,851,102 A | * | 12/1998 | Okawa et al. | 414/783 |
| 5,981,966 A | | 11/1999 | Honma | |
| 6,085,967 A | * | 7/2000 | Grande et al. | 228/212 |
| 6,131,589 A | * | 10/2000 | Vogtmann et al. | 134/113 |
| 6,164,894 A | * | 12/2000 | Cheng | 414/416 |
| 6,167,322 A | * | 12/2000 | Holbrooks | 700/112 |

OTHER PUBLICATIONS

U.S. application No. 09/363,740, Dennis b. Ames et al., Filed Jul. 30, 1999, entitled Wafer Center Alignment Device and Method of Wafer Alignment.

* cited by examiner

Primary Examiner—G. Bradley Bennett
(74) Attorney, Agent, or Firm—Ratner & Prestia; Tiffany L. Townsend, Esq.

(57) ABSTRACT

A jig for aligning a wafer-handling system in a calibration location, such as a wafer pickup-dismount location, with respect to a wafer-processing tool. The jig comprises an alignment fixture adapted to be repeatably mounted on the tool and having one or more edge stops. The jig may further comprise an edge-to-center locator adapted to be mounted on the alignment fixture. The edge-to-center locator has a peripheral edge and a center marker that identifies the precise center of the calibration location when the edge-to-center locator edge is positioned in contact with the edge stop or stops. An alignment method for use of the jig is also disclosed.

24 Claims, 7 Drawing Sheets

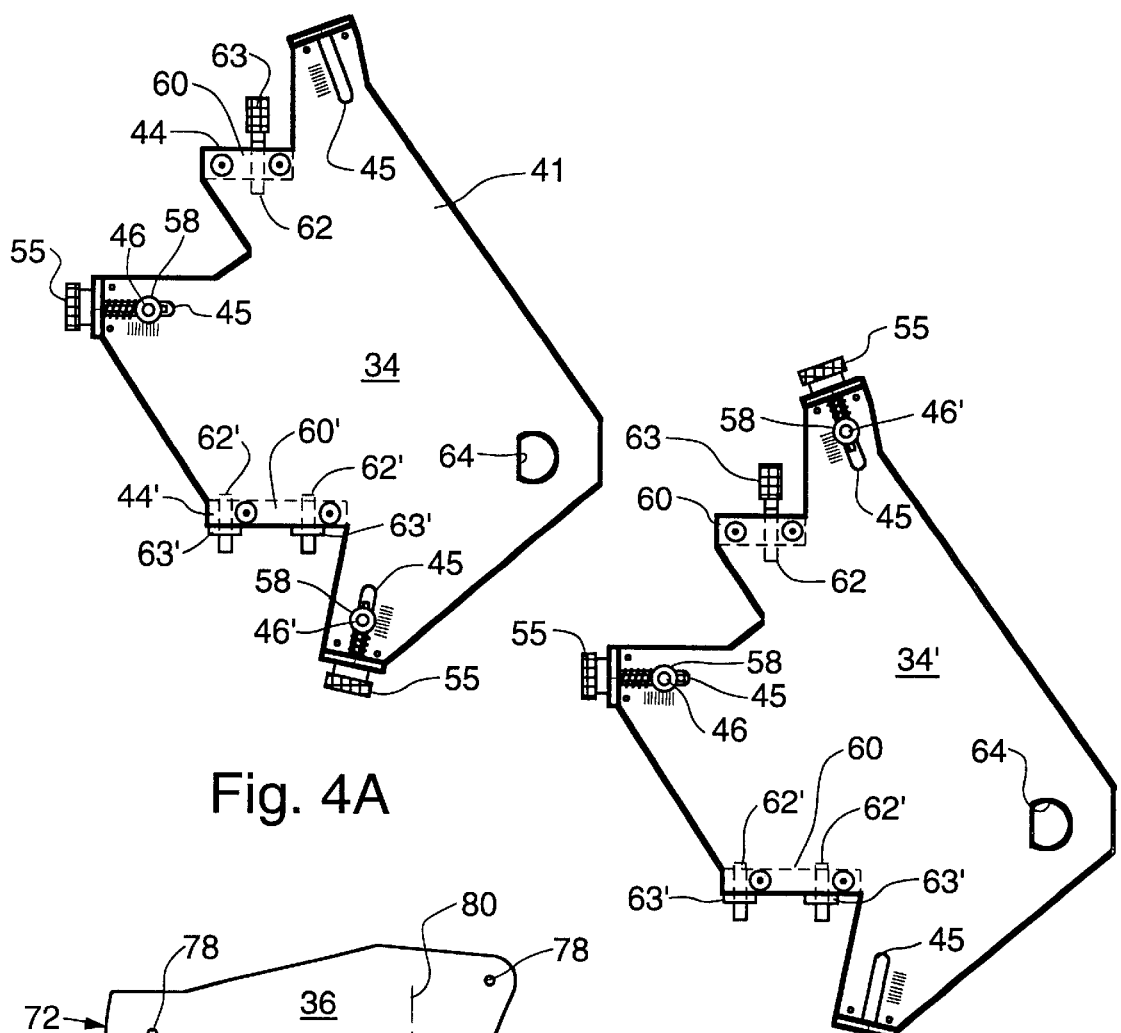
Fig. 4A
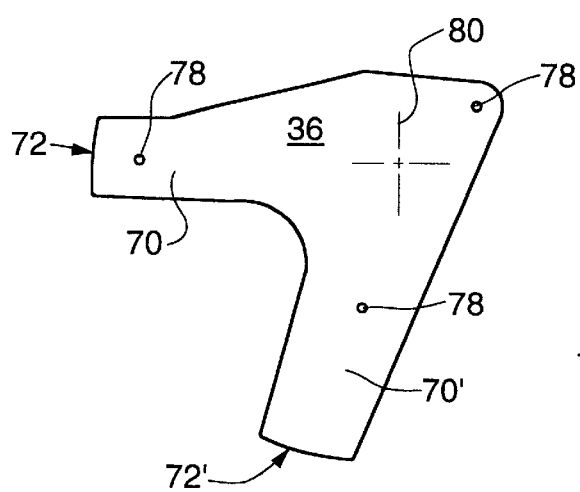
Fig. 4B
Fig. 6A
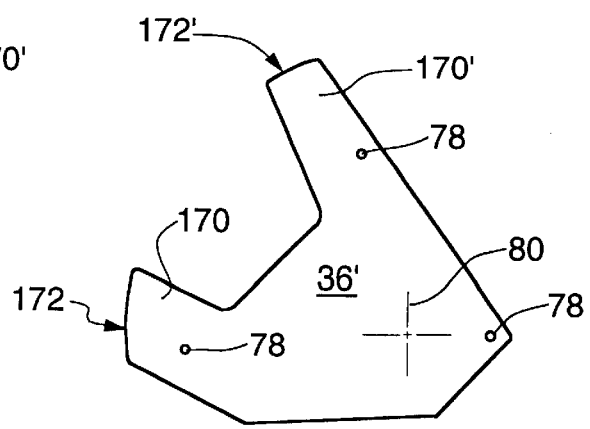
Fig. 6B

WAFER ALIGNMENT JIG FOR WAFER-HANDLING SYSTEMS

TECHNICAL FIELD

The present invention relates generally to semiconductor manufacture and, more specifically, to alignment of wafers within lithography tools.

BACKGROUND OF THE INVENTION

In the manufacture of semiconductors, circuitry patterns are commonly transferred by lithography to multiple chips on a single semiconductor wafer. The lithography process generally comprises coating the wafer with a photoresist, exposing the photoresist in a pattern corresponding to the circuitry pattern desired, and developing the wafer to remove the photoresist in the exposed areas. Further processing, such as etching steps, may then follow using the patterned photoresist as a mask.

Because of the submicron-level resolution of the circuitry patterns and the constant drive to produce quality products with zero defects, the importance of aligning semiconductor wafers properly on the lithography tools is increasing. In an exemplary lithography configuration 200, as shown schematically in FIG. 8, each semiconductor wafer 202 is handled by a track system 204 that performs the step of coating the wafer with photoresist and then delivers the coated wafer to a lithography tool 206 at a pickup-dismount location 210. Track system 204 typically uses a robot 212 to transfer wafer 202. After wafer 202 is delivered by robot 212 of track system 204, a robotic component of lithography tool 206, such as a stepper robot 214, typically picks up the wafer 202 and takes it to a pre-aligner 216, where the center of the wafer 202 is determined. From the pre-aligner 216, the wafer 202 travels to the exposure chuck (not shown), where the wafer 202 is precisely loaded for alignment and exposure.

The transfer of wafer 202 from one robot to the other at pickup-dismount location 210 is critical, because the wafer 202 must be perfectly aligned at each step of the process. If the robot 212 of the track system 204 somehow becomes misaligned with the stepper robot 214 of the lithography tool 206, then the placement of wafer 202 within capture range of pre-aligner 216 (a range, for example a ±4 mm×±4 mm window, within which the wafer center must be located for the wafer 202 to be further processed correctly) may be out-of-tolerance, potentially affecting final product quality. Therefore, the alignment of the robots 212, 214 with one other at pickup-dismount location 210 must be periodically re-calibrated.

Wafer-handling robots are generally of two types: edge-handling robots that handle the wafer from the edges, and center-handling robots that handle the wafer from the center. Stepper robots are almost exclusively center-handling robots, whereas track robots may generally be edge-handling or center-handling robots. Edge-handling robots are typically aligned to a wafer center position, whereas center-handling robots are typically aligned to a wafer edge position.

Referring now to FIG. 1, there is shown a tilt-plate assembly 10. Tilt-plate assembly 10 is mounted to the lithography tool (not shown in FIG. 1) by placement of alignment pegs 20 in corresponding indents (not shown) in the tool. Tilt-plate assembly 10 has an upper side edge 66 and a lower side edge 68. Tilt-plate assembly 10 is typically held in place by a tensioned cross-piece 22 inserted through a hole 24 and positioned crosswise within an indent 26. The track system robot (not shown) typically places the wafer (not shown) on tilt-plate assembly 10 with its underside touching only the tool balls on the tooling arms 14 and the tooling post 16 that extend from the tilt-plate assembly 10.

The lithography tool robot (not shown) then picks up the wafer from tilt-plate assembly 10 for further processing. A known method of calibrating the alignment of the respective robots with respect to wafer placement on the tilt-plate assembly 10 is to draw an arc on each robotic arm in the position where the edge of the wafer should be located when handled by that robot. Misalignment of the wafer edge with respect to the arc drawn on the robot arm indicates misalignment of the robots. To recalibrate, the robot positions are then adjusted by trial and error until the arcs and edges are aligned correctly. This process is time-consuming and not readily repeatable because there is no fixed reference point for both robots.

Thus, there is a need in the industry for a wafer alignment jig for a wafer-handling system that allows fast, repeatable calibration of the alignment of wafer-handling systems with one another.

SUMMARY OF THE INVENTION

To meet this and other needs, and in view of its purposes, the present invention provides a jig for aligning a wafer-handling system calibration location, such as a wafer pickup-dismount location, with respect to a wafer-processing tool. The jig comprises an alignment fixture adapted to be repeatably mounted on the tool and having one or more edge stops. The jig may further comprise an edge-to-center locator adapted to be mounted on the aunt fixture and having a peripheral edge and a center marker. The center marker identifies the precise center of the calibration location when the edge-to-center locator peripheral edge is positioned in contact with the one or more alignment fixture edge stops.

The present invention further comprises a method of aligning a wafer-handling system in a calibration location with respect to a wafer-processing tool. The method comprises the step of (a) mounting a pre-calibrated jig to the tool in the calibration location, the jig comprising an alignment fixture having one or more edge stops. Then, in step (b), a wafer is placed in the calibration location by the wafer-handling system. Next, in step (c), the alignment of the wafer with the alignment fixture is evaluated and, in step (d), the wafer-handling system is adjusted. Steps (b) through (d) are repeated as necessary, in step (e), until the wafer is placed in step (b) so that the wafer is considered aligned with the alignment fixture in step (c).

Before step (a), the jig may be pre-calibrated by (i) mounting the fixture to the tool in the calibration location; (ii) placing a wafer in the calibration location with the wafer-handling system, the wafer having been pre-aligned to the wafer-handling system by a sequentially adjacent processing tool; (iii) adjusting the one or more alignment fixture edge stops to be positioned in contact with the wafer peripheral edge; and (iv) fixing the one or more edge stops in such position.

The calibration location may be a wafer pickup-dismount location for more than one wafer-handling system, in which case the method comprises carrying out steps (a) through (e) for a first wafer-handling system, and then repeating steps (a) through (e) for additional wafer-handling systems until all the systems have been calibrated.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 4A is an isolated schematic illustration plan view of the alignment fixture of FIG. 2;

FIG. 4B is an isolated schematic illustration plan view of the edge-to-center locator of FIG. 2;

FIG. 6A is an isolated schematic illustration plan view of the alignment fixture of FIG. 5;

FIG. 6B is an isolated schematic illustration plan view of the edge-to-center locator of FIG. 5;

DETAILED DESCRIPTION OF INVENTION

Figure 1:
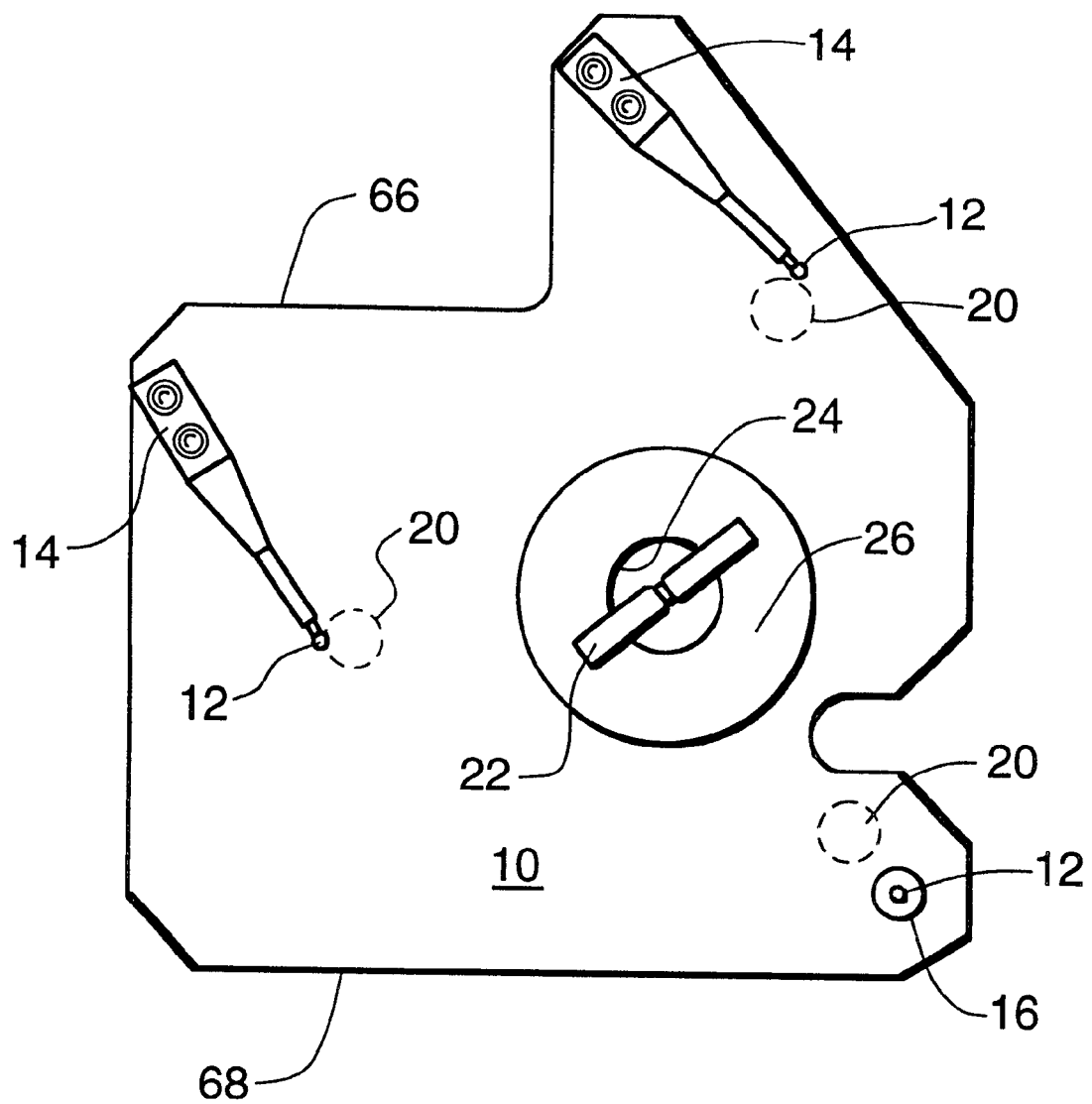
FIG. 1 is a schematic illustration plan view of a tilt-plate assembly known in the art.
Figure 2:
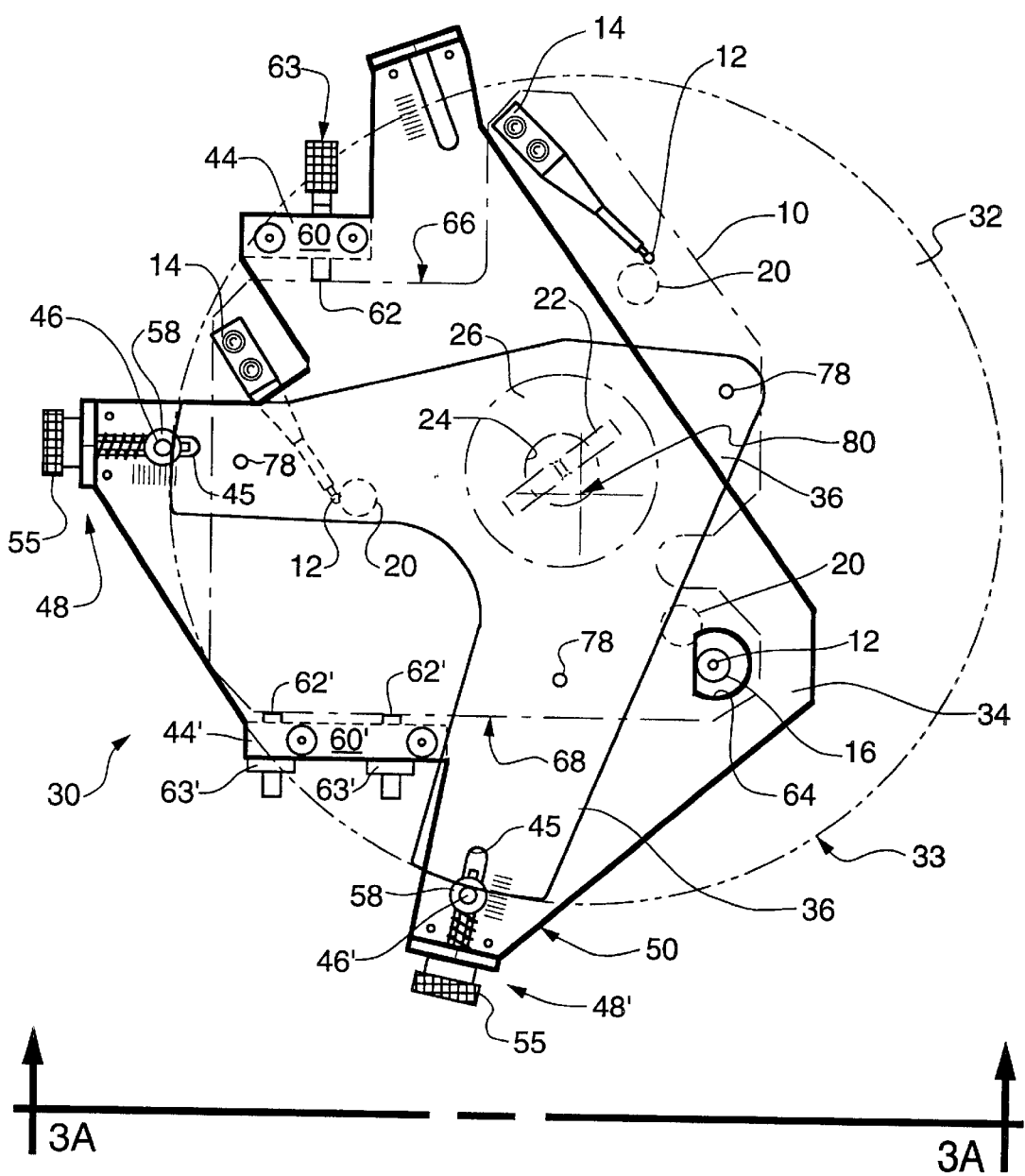
FIG. 2 is a schematic illustration plan view of an exemplary assembled jig of the present invention mounted on the tilt-plate assembly of FIG. 1 and having a wafer mounted on the jig, each element depicted transparently to show the alignment of elements.

Referring now to the drawing, in which like reference numbers refer to like elements throughout, FIGS. 2, 3A, 3B, 4A, and 4B show schematic illustrations of an exemplary, assembled, alignment jig 30 of the present invention. Such a jig 30 having the features described below provides a repeatable, fixed calibration point, but can be removed after calibration so that it is not in the way of wafer movement during normal operation. FIG. 2 shows exemplary jig 30 mounted on tilt-plate assembly 10 with a wafer 32 mounted on the jig. Wafer 32 has a peripheral edge 33. Alignment jig 30 comprises an alignment fixture 34 and an edge-to-center locator 36, each shown in an isolated illustration in FIGS. 4A and 4B, respectively. Not all alignment jigs have an edge-to-center locator 36. To show the alignment of elements over tilt-plate assembly 10 and with respect to each other, wafer 32, alignment fixture 34, and edge-to-center locator 36 are depicted transparently in FIG. 2.

Figure 3A:
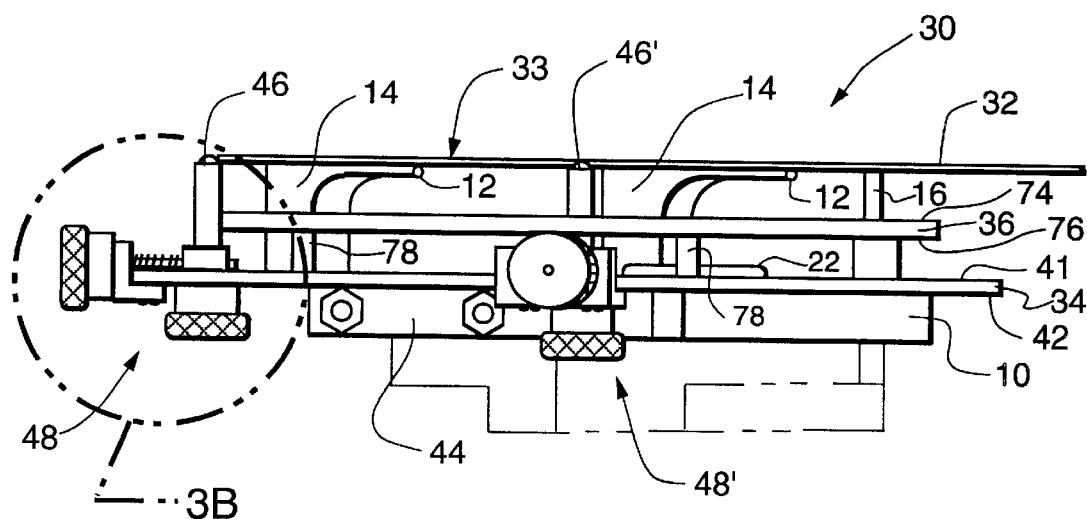
FIG. 3A is a schematic illustration side view of the assembled jig taken along the line 3A-3A of FIG. 2.
Figure 3B:
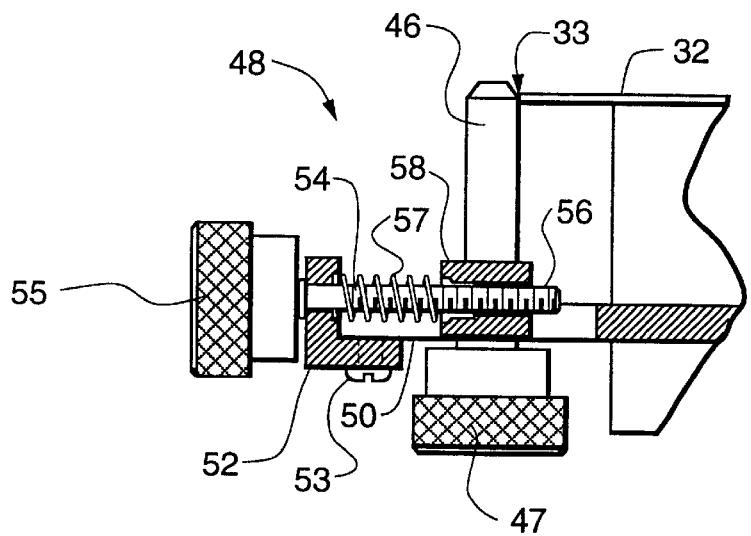
FIG. 3B is a schematic illustration detailed side view of the clamp assembly encircled in FIG. 3A.

Alignment fixture 34 has a top side 41 and an underside 42, as shown in FIG. 3A. Two clamp fixtures 44 and 44' are mounted on underside 42. Two edge locator pin assemblies 48 and 48' attach to the edge 50 of alignment fixture 34 with an L-bracket 52 held in place by a set screw 53, as shown in FIG. 3B. Edge locator pin assemblies 48 and 48' are identical, and each comprises an edge locator pin 46 and 46', respectively. Each edge locator pin 46 and 46' originates from a knob 47 on underside 42 of alignment fixture 34, extends through a slot 45, and projects vertically from top side 41. An adjustment screw 54 has external threads on its inner end 56 that mate with internal threads in the base 58 of edge locator pin 46 so that, as knob 55 is turned, edge locator pin 46 and base 58 are moved toward or away from knob 55 as desired. The spring 57 around screw 54 between base 58 and L-bracket 52 enables smooth adjustment by preventing backlash. Once edge locator pin 46 has been placed in the desired position, knob 47 can be tightened against underside 42 of alignment fixture 34 to fix the position of edge locator pin 46.

Clamp fixtures 44 and 44' comprise blocks 60 and 60' having protruding stops 62 and 62', respectively. As shown in FIGS. 2 and 4A, clamp fixture 44 comprises a single stop 62 protruding through one end of block 60 and having a knob 63 on the opposite end for manual adjustment of the distance the stop 62 protrudes. Clamp fixture 44' has two stops 62' protruding through one end of block 60', each stop 62' having on the opposite end a nut 63' for fixing the protrusion distance of the stop 62'.

Alignment fixture 34 further comprises a D-shaped hole 64. Thus, alignment fixture 34 has essentially a three-point alignment system allowing it to be repeatably placed onto tilt-plate assembly 10. Two of the three points are where each stop 62' of clamp fixture 44' contacts the lower side edge 68 of the tilt-plate assembly 10, and the third point is where post 16 contacts the edge of D-shaped hole 64 through which the post 16 extends. Stop 62 on clamp fixture 44 can be manually adjusted by turning knob 63 until the stop 62 contacts the upper side edge 66 of the tilt-plate assembly 10, thus temporarily affixing alignment fixture 34 to tilt-plate assembly 10 for the duration of the calibration procedure. Thus, with respect to FIG. 2, alignment fixture 34 is held in place on tilt-plate assembly 10 in the up-down direction by stops 62 and 62', and in the left-right direction by post 16 and friction between stops 62, 62' and corresponding edges 66, 68 of the tilt-plate assembly 10. The meandering peripheral outline of alignment fixture 34 allows it to be placed on tilt-plate assembly 10 without interfering with arms 14.

Edge-to-center locator 36 (shown isolated in FIG. 4B) fits atop alignment fixture 34 as shown in FIGS. 2 and 3A, and further comprises edge extensions 70 and 70' each having a contact edge 72 and 72', respectively. Contact edges 72 and 72' are sectors of a circular disc having the same radius as the standard wafers handled by the handling system. Therefore, when edge-to-center locator 36 is placed atop alignment fixture 34, there is only one precise location where both contact edges 72 and 72' are in simultaneous contact with edge locator pins 46 and 46', respectively.

Edge-to-center locator 36 has a top side 74 and an underside 76. Underside 76 includes a set of spacers 78 to space edge-to-center locator 36 a predetermined distance from alignment fixture 34, as shown in FIG. 3A. A predetermined distance means a reasonably predictable, as opposed to random, distance as fixed by the height of spacers 78. Top side 74 includes cross-hairs 80 that mark the location corresponding to the precise center of wafer 32 when placed with both contact edges 72 and 72' in simultaneous contact with edge locator pins 46 and 46'. Other types of center markers could also be used.

The alignment jig 30 in FIG. 2 is an applicable for use with center-handling wafer track systems, in particular those manufactured by Silicon Valley Group, Inc. (SVG) of San Jose, Calif. For edge-handling wafer track systems, such as those made by DNS Electronics (DNS) of Sunnyvale, Calif.

and Tokyo Electron America (TEL) of Austin, Tex., however, the location of edge locator pin 46' on jig 30 interferes with the robot motion and is therefore impractical for use.

Figure 5:
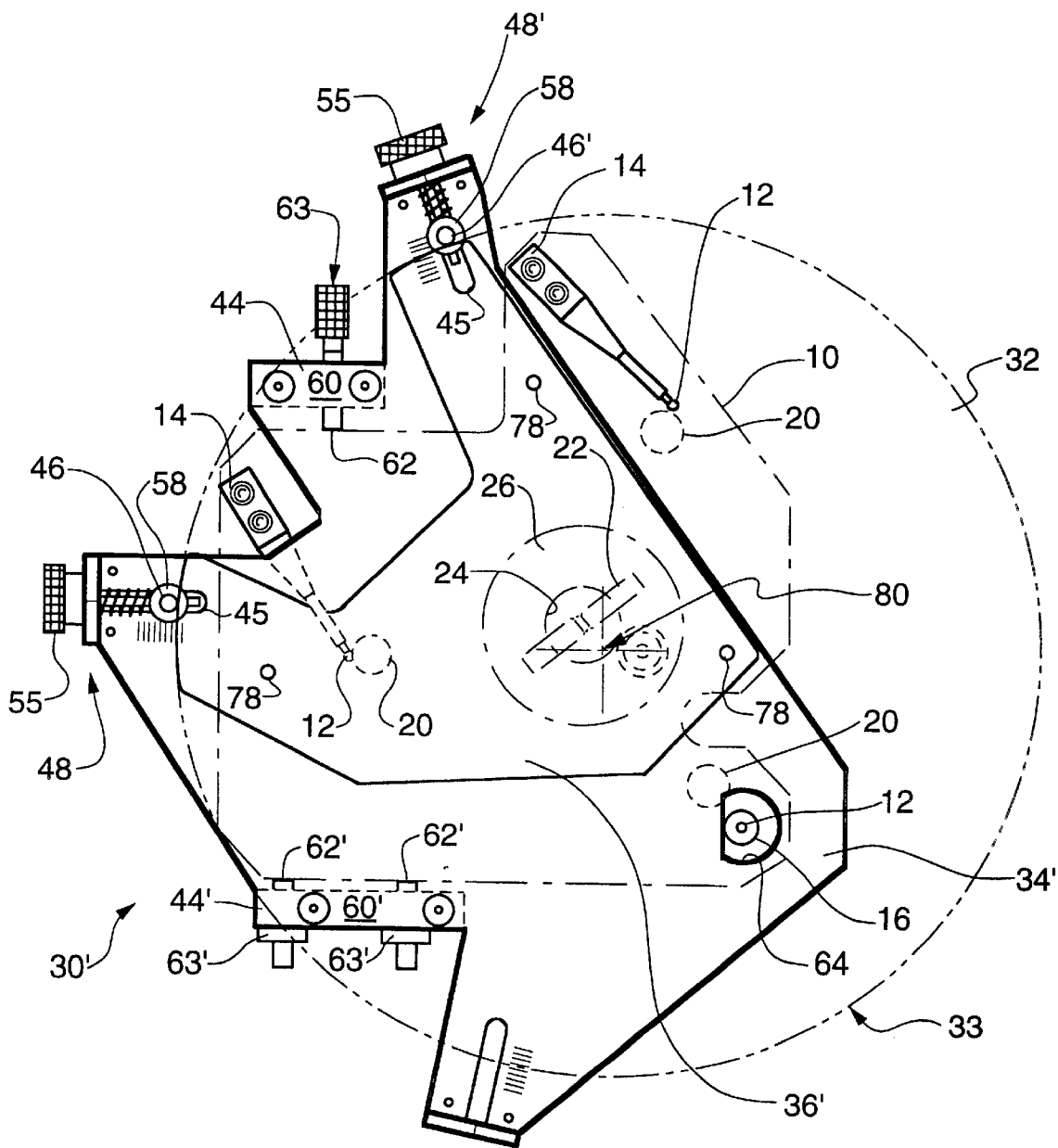
FIG. 5 is a schematic illustration plan view of another exemplary assembled jig of the present invention mounted on the tilt-plate assembly of FIG. 1 and having a wafer mounted on the jig, each element depicted transparently to show the alignment of elements.

Thus, referring now to FIGS. 5, 6A, and 6B there is shown an alignment jig 30' comprising an alignment fixture 34' and an edge-to-center locator 36' compatible with the DNS and TEL edge-handling robot applications. The various components of alignment fixture 34' and edge-to-center locator 36' of jig 30' are the same as for alignment fixture 34 and edge-to-center locator 36, respectively, of jig 30. The primary difference lies in the location of edge locator pin assemblies 48' and the peripheral outline of edge-to-center locator 36'. Thus, edge-to-center locator 36' has edge extension 170 and 170' and corresponding contact edges 172 and 172' analogous to, but having different geometry than, extensions 70 and 70' and edges 72 and 72' of edge-to-center locator 36.

Other alignment jigs may be designed having various geometries and orientations and having corresponding alignment fixtures adapted to fit the corresponding tool and the track systems used with those components. Likewise, the corresponding edge-to-center locator can be adapted to the alignment fixture and handling system in any geometry to avoid interference with robotic motion or tool components. Furthermore, the alignment fixture may have another type of edge stop or stops in place of the two edge locator pins 46, 46' shown in FIGS. 2, 3A, 3B, 4A, and 6A above, so long as such edge stop or stops provide only one possible location for the edge-to-center locator. For instance, if the geometry of the tool and the robotic handler so allow, a single continuous stop could serve in place of two separate stops located at the endpoints of the continuous stop. Similarly, such a continuous stop could be broken down into more than two discrete stops.

A jig according to the present invention must provide an alignment fixture, however, adapted to be repeatably mounted on the corresponding tool and having one or more edge stops. The jig may further comprise an edge-to-center locator that has a peripheral edge and a center marker that identifies the precise center of the wafer position when the edge-to-center locator peripheral edge is in contact with the one or more alignment fixture edge stops.

Figure 7:
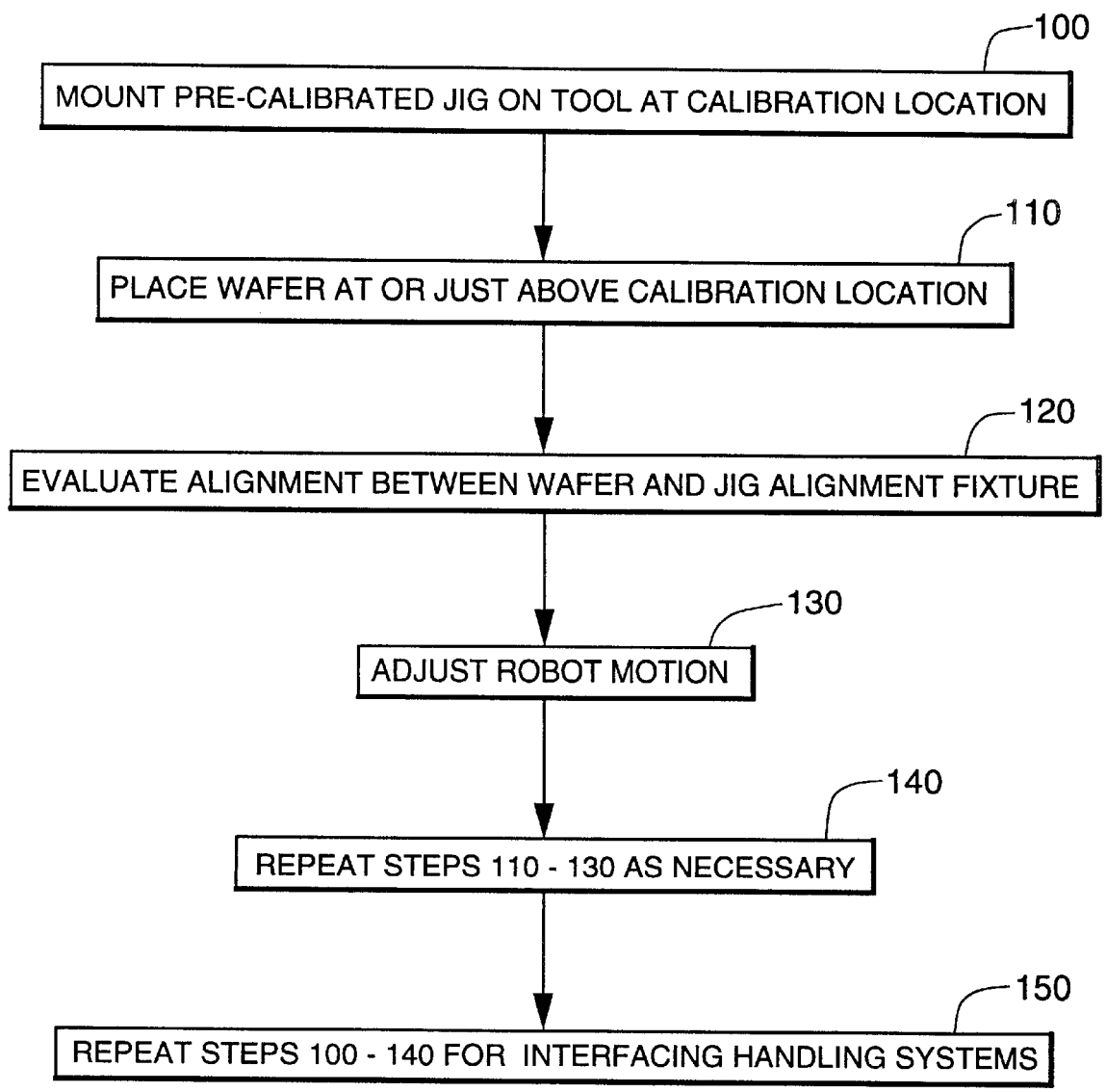
FIG. 7 is flowchart depicting an exemplary method according to the present invention.

The alignment jig of the present invention, such as jig 30 shown in FIG. 2, may be used to carry out an exemplary alignment method as shown in FIG. 7. Although described as specifically related to the track system and lithography tool in this application, the method is applicable to alignment of a wafer-handling system in any calibration location with respect to a processing tool, such as a pickup-dismount location of a single wafer-handling system, or a pickup-dismount location shared by a plurality of wafer-handling systems. The term "pickup-dismount location" refers to any location that may be a pickup location for one or more wafer-handling systems, a dismount location for one or more wafer-handling systems, or both.

Referring now to the flowchart of FIG. 7 depicting method steps and to FIG. 2 showing exemplary physical relationships among components, in step 100, a pre-calibrated jig 30 is first affixed to a wafer-processing tool at the location to be calibrated (for example, jig 30 is affixed to the tilt-plate assembly 10 as shown in FIG. 2). Then, in step 110, a wafer 32 is placed by the wafer-handling system in the position to be calibrated (for example, track system 204 places wafer 32 on tooling balls 12 of tilt-plate assembly 10 as shown in FIG. 2). Then, in step 120, the alignment of wafer 32 with jig 30 is evaluated, such as by an operator who observes the relationship between edge locator pins 46 and 46' of alignment fixture 34 and the peripheral edge 33 of wafer 32. In step 130, the operator adjusts the robot motion as necessary and, in step 140, repeats steps 110, 120, and 130 until the wafer 32 is placed in step 110 in a position that is considered in step 120 to be in alignment with the alignment fixture 34. Such adjustment may comprise "teaching" the robot by moving the robot to a position where the wafer 32 is aligned and setting the robot to go to that position.

In general, a center-handling robot such as is calibrated by using edge-locator pins 46 and 46' sets the wafer 32 into place by releasing vacuum on the wafer 32, for instance, and delivering the wafer 32 into place in the calibration position. Thus, to facilitate teaching the robot the correct position, the wafer 32 may be positioned just above the calibration location in step 110 so that the robot sequence is stopped just before the robot delivers the wafer 32 onto tilt-plate assembly 10. Alignment may be first roughly evaluated in this position and the robot arm "taught" to adjust the position before actually delivering the wafer 32 onto the tilt-plate assembly 10. Fine adjustments may be made by allowing the robot to actually deliver the wafer 32 into place in the calibration location, then evaluating alignment and finely adjusting the robot parameters accordingly.

Jig 30 is referred to as being pre-calibrated in the method above, because the jig itself needs to be calibrated only a single time upon first use. The jig itself is pre-calibrated by first mounting the uncalibrated jig to the tool at the location to be calibrated (for example, jig 30 is affixed to tilt-plate assembly 10 as shown in FIG. 2). Then a pre-aligned wafer, which may be any standard product quality wafer typically handled by the handling system, is placed at the calibration location by the wafer-handling system (for example, wafer 32 is placed on tooling balls 12 of tilt-plate assembly 10 as shown in FIG. 2).

Reference to the "pre-aligned" wafer means that the wafer has been aligned to the wafer-handling system by a sequentially adjacent processing tool. The sequentially adjacent processing tool may be the tool from which the wafer-handling system normally picks up the wafer before placing it at the location being calibrated, or the tool to which the wafer-handling system normally takes the wafer after passing through the calibration location.

Figure 8:
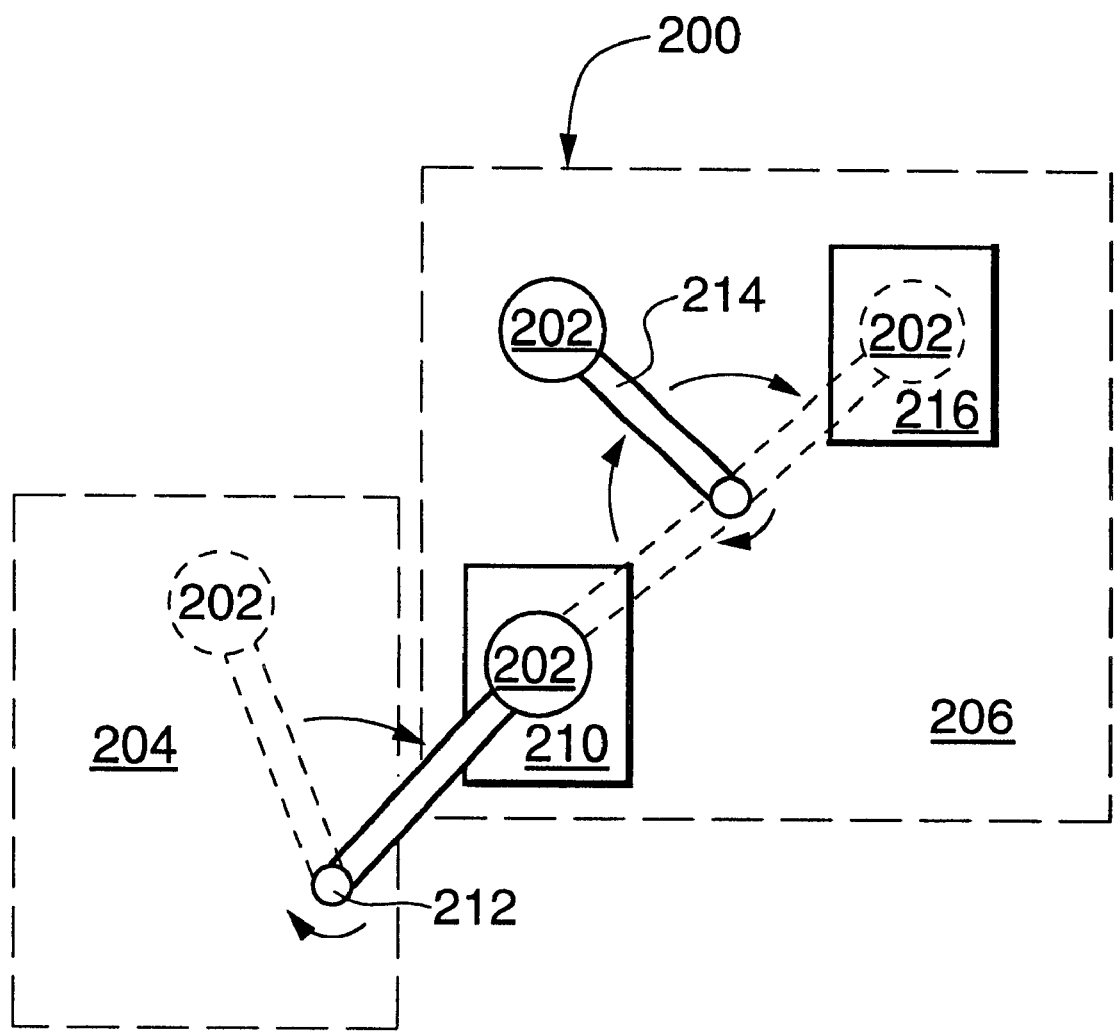
FIG. 8 is a schematic block diagram showing interfacing wafer-handling systems in an exemplary process known in the art.

For example, in lithography configuration 200 as shown in FIG. 8, wafer 202 may be handled by robot 212 of track system 204 that places the wafer 202 at the pickup-dismount location 210, from which stepper robot 214 picks up wafer 202 and places it on pre-aligner 216 before wafer 202 is picked up by a flip-and-repeat arm (not shown) and taken to the exposure chuck (not shown). A wafer 202 that has been aligned by pre-aligner 216, picked up by stepper robot 214, and placed back at pickup-dismount location 210 is in the correct position to which the jig 30 of the present invention can be calibrated.

Calibration of the jig 30 comprises mounting jig 30 to the tool at the location to be calibrated, adjusting the edge stop or stops of alignment fixture 34 (such as by moving edge locator pins 46 and 46' of edge locator pin assemblies 48 and 48' by turning knob 55 as shown in FIG. 2) to a position in contact with the peripheral edge 33 of wafer 32. Edge stops (edge locator pins 46 and 46') are then fixed in that position (such as by tightening knob 47). To assure that there is no drift in the wafer-handling system used for calibrating the jig 30, a wafer placed in the calibrated jig 30 may then be picked up by that wafer-handling system and returned to the sequentially adjacent processing tool (for instance, stepper robot 214 may pick up the wafer 202 from calibrated jig 30 and place it on pre-aligner 216, which can determine if the wafer 202 is aligned). Adjustment to the calibration can be made, if necessary.

Steps 100, 110, 120, 130, and 140 may comprise a completed method if only a single wafer-handling system is to be calibrated. For calibration of a wafer pickup-dismount location involving two or more wafer-handling systems, in step 150, steps 100, 110, 120, 130, and 140 are repeated for additional wafer-handling systems. Where the calibration location is merely a pickup location for one wafer handler, that handler is programmed to reverse its steps to pick up a wafer in a position where it normally delivers the wafer, and transfer it to the position where it normally picks the wafer up. For calibration of some wafer-handling systems, such as the stepper robot of a lithography tool or other center-handling wafer-handling systems, including some track systems, a jig having only edge stops may be sufficient.

For calibration of other wafer-handling systems, such as an edge-handling track system, however, the jig may further comprise edge-to-center locator 36, and the calibration method in step 120 may further comprise evaluation of the alignment with respect to a center marker, such as cross-hairs 80 as shown in FIG. 2, on the edge-to-center locator 36. This evaluation may be facilitated by use of a special calibration wafer (not shown), such as a calibration wafer that is the subject of the co-pending application titled "WAFER CENTER ALIGNMENT DEVICE AND METHOD OF WAFER ALIGNMENT" and filed contemporaneously with the present application on behalf of co-inventors Dennis Ames and Michael Schade and incorporated in this application by reference. Such a calibration wafer may be considered aligned when the calibration wafer center marker and edge-to-center locator center marker are aligned within a predetermined tolerance. A predetermined tolerance means a tolerance fixed by design before calibration begins.

The calibration wafer comprises a center marker, such as a precisely aligned center pin (not shown) protruding from its underside, and may be transparent at least in the region surrounding the pin. Thus, in step 120, the alignment of the calibration wafer center marker with the edge-to-center locator center marker is evaluated, such as by an operator observing through the transparent region to see the relationship between the calibration wafer center pin and cross-hairs 80 on edge-to-center locator 36. Other types of calibration wafers with different types of center markers may also be used as detailed in the co-pending application.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A wafer processing tool calibration jig for aligning a wafer in a calibration location with respect to a wafer-processing tool, the jig comprising:
    an alignment fixture comprising means for removably mounting the fixture on the wafer-processing tool, and at least one edge stop means for unyieldingly contacting a periphery of the wafer when the wafer is aligned in the calibration location.

2. The wafer processing tool calibration jig of claim 1 further comprising:
    an edge-to-center locator mounted on the alignment fixture, the edge-to-center locator having a peripheral edge and a center marker identifying a precise center of the calibration location when the peripheral edge of the edge-to-center locator is positioned in contact with the at least one edge stop means.

3. The jig according to claim 2 wherein the edge-to-center locator center marker comprises a visual alignment device.

4. The jig according to claim 2 wherein the edge-to-center locator center marker comprises a set of cross-hairs.

5. A wafer processing tool comprising a first wafer-handling system, a second wafer-handling system, and the wafer processing tool calibration jig of claim 1 wherein the calibration location is a wafer pickup-dismount location that is a wafer dismount location of the first wafer-handling system and a wafer pickup location of the second wafer-handling system.

6. The wafer processing tool of claim 5 wherein the tool is a lithography tool.

7. A wafer-handling system comprising the wafer processing tool calibration jig of claim 1 wherein the wafer-handling system comprises an edge-handling system adapted to handle the wafer by the wafer edge.

8. A wafer-handling system comprising the wafer processing tool calibration jig of claim 1 wherein the wafer-handling system comprises a center-handling system adapted to handle the wafer by the wafer center.

9. The wafer processing tool calibration jig of claim 1 wherein the alignment fixture permits rotation of the wafer when aligned on the alignment jig.

10. A wafer processing tool comprising a calibration location for aligning a wafer with the wafer processing tool and a calibration jig for aligning the wafer in the calibration location, the jig comprising an alignment fixture having means for removably mounting the fixture on the wafer-processing tool, and at least one edge stop means for contacting a periphery of the wafer when the wafer is aligned in the calibration location.

11. A wafer-processing tool comprising a tilt-plate assembly and a wafer processing tool calibration jig comprising an alignment fixture having means for removably mounting the fixture on the tilt plate assembly and at least one edge stop means for contacting a periphery of the wafer when the wafer is aligned on the jig.

12. The wafer processing tool of claim 11 wherein the means for removably mounting the fixture on the tilt-plate assembly comprises a three-point alignment system.

13. A wafer-processing tool, comprising
    a tilt-plate assembly having a post and a peripheral edge; and
    a wafer processing tool calibration jig comprising an alignment fixture comprising: at least two contact points for contacting the tilt-plate assembly peripheral edge for removably mounting the fixture on the tilt-plate assembly in a calibration location; at least one edge stop adapted to contact a periphery of the wafer when the wafer is aligned in the calibration location; and a hole having an inside edge positioned so that the tilt-plate assembly post protrudes through the hole and contacts the inside edge when the alignment fixture is mounted on the tilt-plate assembly.

14. The wafer processing tool of claims 13 wherein the alignment fixture further comprises an edge-to-center locator having a peripheral edge and a center marker identifying a precise center of the calibration location when the peripheral edge of the edge-to-center locator is positioned in contact with the at least one edge stop.

15. The wafer processing tool of claim 14 wherein the edge-to-center locator center marker comprises a visual alignment device.

16. The wafer processing tool of claim 14 wherein the edge-to-center locator center marker comprises a set of cross-hairs.

17. The wafer processing tool of claim 13 further comprising a first wafer-handling system and a second wafer-handling system, wherein the calibration location is a wafer pickup-dismount location that is a wafer dismount location of the first wafer-handling system and a wafer pickup location of the second wafer-handling system.

18. The wafer processing tool of claim 17 wherein at least one of the first wafer-handling system and the second wafer-handling system comprises an edge-handling system adapted to handle the wafer by the wafer edge.

19. The wafer processing tool of claim 17 wherein at least one of the first wafer-handling system and the second wafer-handling system comprises a center-handling system adapted to handle the wafer by the wafer center.

20. The wafer processing tool of claim 13 wherein the hole in the alignment fixture is D-shaped.

21. The wafer processing tool of claim 13 wherein the edge stop is radially adjustable relative to the wafer.

22. The wafer processing tool of claim 13 wherein the alignment fixture comprises a clamp mechanism, a first part of the clamp mechanism comprising the at least two contact points, and a second part of the clamp mechanism comprising a third contact point being adjustable relative to the first part to clamp the alignment fixture onto the tilt-plate assembly.

23. The wafer processing tool of claim 13 wherein the tool comprises a lithography tool.

24. The wafer processing tool calibration jig of claim 1 wherein the edge stop is radially adjustable relative to the wafer.

* * * * *